(12) United States Patent
Nishiuchi et al.

(10) Patent No.: US 7,056,197 B2
(45) Date of Patent: Jun. 6, 2006

(54) DRY SURFACE TREATING APPARATUS AND DRY SURFACE TREATING METHOD USING THE SAME APPARATUS

(75) Inventors: Takeshi Nishiuchi, Osaka (JP); Ikuo Shimamoto, Hyogo (JP); Nobuhiro Misumi, Hyogo (JP); Yoshimi Tochishita, Hyogo (JP)

(73) Assignee: Neomax Co. Ltd., Osaka (JP)

( * ) Notice: Subject to any disclaimer, the term of this patent is extended or adjusted under 35 U.S.C. 154(b) by 0 days.

(21) Appl. No.: 09/901,044

(22) Filed: Jul. 10, 2001

(65) Prior Publication Data

US 2002/0028631 A1 Mar. 7, 2002

(30) Foreign Application Priority Data

Jul. 13, 2000 (JP) .......................... 2000-213427

(51) Int. Cl.
*B24B 31/00* (2006.01)

(52) U.S. Cl. ...................... 451/326; 451/328; 451/32; 451/35

(58) Field of Classification Search ............ 451/32, 451/35, 326, 328, 329
See application file for complete search history.

(56) References Cited

U.S. PATENT DOCUMENTS

| | | | | |
|---|---|---|---|---|
| 3,191,874 | A | * | 6/1965 | Drinkwater et al. |
| 3,948,003 | A | | 4/1976 | Pletscher |
| 4,003,164 | A | | 1/1977 | Carpenter, Jr. et al. |
| 4,116,161 | A | | 9/1978 | Steube |
| 4,691,400 | A | * | 9/1987 | Arneson ..................... 15/3 |
| 4,757,648 | A | | 7/1988 | Carpenter et al. |
| 5,531,637 | A | * | 7/1996 | Kimura ..................... 451/329 |
| 5,535,604 | A | * | 7/1996 | Rodrigues et al. ......... 451/328 |
| 5,782,677 | A | * | 7/1998 | Kanouse ..................... 451/85 |

FOREIGN PATENT DOCUMENTS

| | | |
|---|---|---|
| CN | 1105649 A | 10/1908 |
| EP | 0 049 404 | 4/1982 |
| EP | 1 055 744 | 11/2000 |
| EP | 1 136 587 A2 | 9/2001 |
| GB | 1 074 901 | 7/1967 |
| JP | 07-070738 | 3/1995 |
| JP | 07-216536 | 8/1995 |
| JP | 11-347941 | 12/1999 |

OTHER PUBLICATIONS

Patent Abstracts of Japan for JP 11347941, published Dec. 21, 1999.

* cited by examiner

*Primary Examiner*—Eileen P. Morgan
(74) *Attorney, Agent, or Firm*—Armstrong, Kratz Quintos, Hanson & Brooks, LLP

(57) ABSTRACT

A dry surface treating apparatus of the present invention comprises, within a treating chamber, a surface-treating material supply section and a tubular barrel having a porous peripheral surface for accommodating a work piece, to treat a surface of the work piece while rotating the tubular barrel horizontally arranged about a horizontal rotational axis, wherein the tubular barrel has a slide stop for stopping a slide of the accommodated work piece along an inner peripheral surface of the tubular barrel due to rotation of the tubular barrel.

According to the dry surface treating apparatus of the invention, because the work piece is inverted of surfaces within the tubular barrel, the time the work piece at each surface faces the surface-treating material supply section is made equivalent. Consequently, it is possible to provide even deposited-film formation or surface treatment to the opposite surfaces of a work piece, particularly, a rare earth metal-based permanent magnet in a plate or bow form.

20 Claims, 12 Drawing Sheets

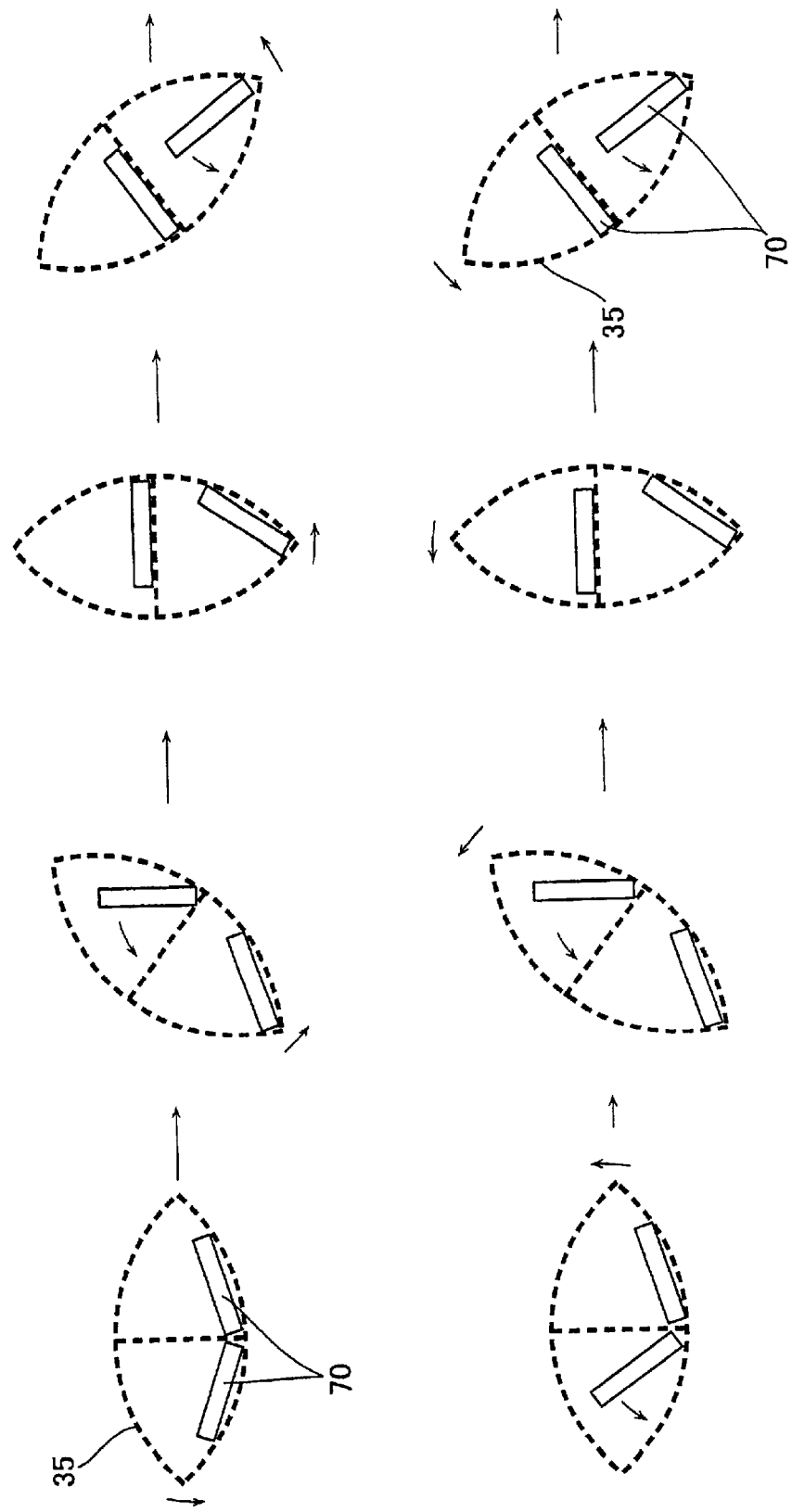

(unit: mm)

(unit: mm)

PRIOR ART

PRIOR ART

DRY SURFACE TREATING APPARATUS AND DRY SURFACE TREATING METHOD USING THE SAME APPARATUS

BACKGROUND OF THE INVENTION

1. Field of the Invention

The present invention relates to an apparatus suited for dry surface treatment, such as a deposition apparatus for evenly forming a deposited film or a blast treating apparatus for surface treatment, to the both surfaces of a work piece of a plate or bow formed rare earth metal-based permanent magnet or the like.

2. Description of the Related Art

A rare earth metal-based permanent magnet such as an R—Fe—B based permanent magnet, of which an Nd—Fe—B based permanent magnet is representative, is used at present in a variety of fields, because it has a high magnetic characteristic.

However, the rare earth metal-based permanent magnet contains metal species (particularly, R) liable to be corroded by oxidation in the atmosphere. Therefore, when the rare earth metal-based permanent magnet is used without being subjected to a surface treatment, the corrosion of the magnet is advanced from its surface due to the influence of a small amount of acid, alkali and/or water to produce rust, thereby bringing about the deterioration and dispersion of the magnetic characteristic. Further, when the magnet having the rust produced therein is incorporated into a device such as a magnetic circuit, there is a possibility that the rust is scattered to pollute surrounding parts or components.

With the foregoing in view, it is a conventional practice to form a deposited film of aluminum or the like on the surface of a rare earth metal-based permanent magnet for the purpose of providing an excellent corrosion resistance to the rare earth metal-based permanent magnet.

Examples of conventionally known apparatus used for forming a deposited film of aluminum or the like on the surface of a rare earth metal-based permanent magnet, include an apparatus described in U.S. Pat. No. 4,116,161 and an apparatus described in Graham Legge "Ion Vapor Deposited Coatings for Improved Corrosion Protection" Reprinted from Industrial Heating, September, 135–140, 1994. FIG. 13 is a diagrammatic front view (a partially perspective view) of the inside of a vacuum-treating chamber 301 connected to an evacuating system (not shown) in one example of such apparatus. Two cylindrical barrels 305, for example, formed of a mesh net of a stainless steel are disposed side-by-side in an upper area in the chamber for rotation about a horizontal rotational axis 306. A plurality of boats 302, which are evaporating sections for evaporating aluminum as a depositing material, are disposed on a boat support base 304 risen on a support table 303 in a lower area in the chamber.

With this apparatus, a plurality of plate-formed rare earth metal-based permanent magnets 340 as work pieces for example are placed into each of the cylindrical barrels 305, and aluminum is evaporated from the boats 302 heated to a predetermined temperature by a heating means (not shown), while rotating the cylindrical barrels about the rotational axis 306, as shown by an arrow in the figure, thereby forming a deposited film of aluminum on the surface of each of the magnets 340 in the cylindrical barrels 305.

The deposited-film forming apparatus shown in FIG. 13 is capable of treating a large amount of the work pieces and excellent in productivity. However, because the deposition of the depositing material to the magnet is only in one direction due to the apparatus structure, film formation is preferentially to the one surface on a side facing the evaporating section. In particular, where treating the magnets in a plate or bow form, there have been cases that large dispersion in film thickness occurs on between the side facing the evaporating section and the opposite side. This phenomenon is conspicuous for the large-sized magnet having a unit weight of 20 g or the greater because the magnet 340 slides along a barrel inner peripheral surface due to rotation of the cylindrical barrel 305 and its one surface faces the evaporating section at all times as shown in FIG. 14.

Meanwhile, conventionally, blast treating apparatuses have been used in the surface treatment of rare earth metal-based permanent magnets, i.e. in the removal of an oxidation layer formed on the surface, surface cleaning, shot peening for finishing the surface treated film and so on. There are various classifications for the blast treating apparatuses. For example, the tumbler-type apparatus has an injection nozzle such that a plurality of magnets are inserted in a drum of the apparatus so that a blast material is injected to the magnet through an opening of the drum while stirring the magnets by rotating the drum (Japanese Patent Laid-open No. 347941/1999). In such an apparatus, however, the blast material to the magnets is injected only through the drum opening. Accordingly, where treating the magnets in a plate or bow form in particular, there is a case that a large dispersion occurs in the degree of treatment between the respective surfaces similarly to that in the foregoing deposition apparatus.

SUMMARY OF THE INVENTION

Accordingly, it is an object of the present invention to provide an apparatus suited for dry surface treatment, such as a deposition apparatus for evenly forming a deposited film or a blast treating apparatus for surface treatment, to the both surfaces of a work piece of a plate or bow formed rare earth metal-based permanent magnet or the like.

The present invention has been made in view of the foregoing point, and a dry surface treating apparatus of the invention comprises, within a treating chamber, a surface-treating material supply section and a tubular barrel having a porous peripheral surface for accommodating a work piece, to treat a surface of the work piece while rotating the tubular barrel horizontally arranged about a horizontal rotational axis, wherein the tubular barrel has a slide stop for stopping a slide of the accommodated work piece along an inner peripheral surface of the tubular barrel due to rotation of the tubular barrel.

Also, in the apparatus of the invention, the tubular barrel is in a vertical sectional form with respect to the rotational axis having at least one corner at an internal angle of 30° to 100°, the corner being provided as the slide stop.

Also, in the apparatus of the invention, the tubular barrel is in a vertical sectional polygonal form with respect to the rotational axis having at least three corners at internal angles of 30° to 100°, the corners being provided as the slide stops.

Also, in the apparatus of the invention, the tubular barrel is in a vertical sectional form of a regular triangle with respect to the rotational axis.

Also, in the apparatus of the invention, the tubular barrel is in a vertical sectional form of a square with respect to the rotational axis.

Also, in the apparatus of the invention, the tubular barrel is in a vertical sectional form of a rhombus with respect to the rotational axis.

Also, in the apparatus of the invention, the tubular barrel is in a vertical sectional form of a convex-formed curve in a part thereof with respect to the rotational axis.

Also, in the apparatus of the invention, the tubular barrel is in a vertical sectional form of an ellipse or convex-formed lens with respect to the rotational axis.

Also, in the apparatus of the invention, a protrusion is provided on an inner peripheral surface of the tubular barrel, the protrusion being made as the slide stop.

Also, in the apparatus of the invention, the protrusion is provided at an angle of 30° to 100° to a tangential line on a forward side of rotation in the vertical sectional form with respect to the rotational axis of the tubular barrel.

Also, in the apparatus of the invention, the protrusion is in any of a comb form, a plate form and rod form.

Also, in the apparatus of the invention, the protrusion is provided one to seven in the number.

Also, in the apparatus of the invention, the tubular barrel has an interior comprising a plurality of partitioned accommodating sections formed by division into two or more by partitioning members provided vertical to the rotational axis of the tubular barrel.

Also, in the apparatus of the invention, the partitioning member is in a porous form structured by a linear member.

Also, in the apparatus of the invention, the tubular barrel has an interior comprising a plurality of partitioned chambers formed by dividing into two or more the vertical sectional form with respect to the rotational axis of the tubular barrel.

Also, in the apparatus of the invention, the partitioned chamber is in a vertical sectional form with respect to the rotational axis having at least one corner at an internal angle of 30° to 100°, the corner being provided as the slide stop.

Also, in the apparatus of the invention, work pieces are accommodated in the partitioned accommodating sections and/or partitioned chambers on a one-to-one basis.

Also, in the apparatus of the invention, the porous peripheral surface is a mesh-formed peripheral surface.

Also, in the apparatus of the invention, the porous peripheral surface is a slit-formed peripheral surface.

Also, in the apparatus of the invention, the tubular barrels in plurality are annularly supported at a circumferential outward of the rotational axis of a support member rotatable about the rotational axis in a horizontal direction.

Also, in the apparatus of the invention, the dry surface treating apparatus is a deposition apparatus.

Also, in the apparatus of the invention, the dry surface treating apparatus is a blast treating apparatus.

Also, a dry surface treating method for treating a work piece by using the dry surface treating apparatus according to the invention.

Also, in the dry surface treating method according to the invention, the work piece is a rare earth metal-based permanent magnet in a plate or bow form.

Also, in the dry surface treating method according to the invention, the work piece is treated while being inverted of surfaces at the slide stop as a fulcrum.

Also, a rare earth metal-based permanent magnet has been surface-treated by the dry surface treating method according to the invention.

According to the dry surface treating apparatus of the invention, because the work pieces are inverted of surfaces within the tubular barrel, the time the work piece at each surface faces the surface-treating material supply section is made equivalent. Consequently, it is possible to provide even deposited-film formation or surface treatment to the opposite surfaces of a work piece, particularly, a rare earth metal-based permanent magnet in a plate or bow form.

BRIEF DESCRIPTION OF THE DRAWINGS

FIG. 3 is another schematic illustration of behavior of work pieces within the tubular barrel;

DETAILED DESCRIPTION OF THE INVENTION

Figure 1:
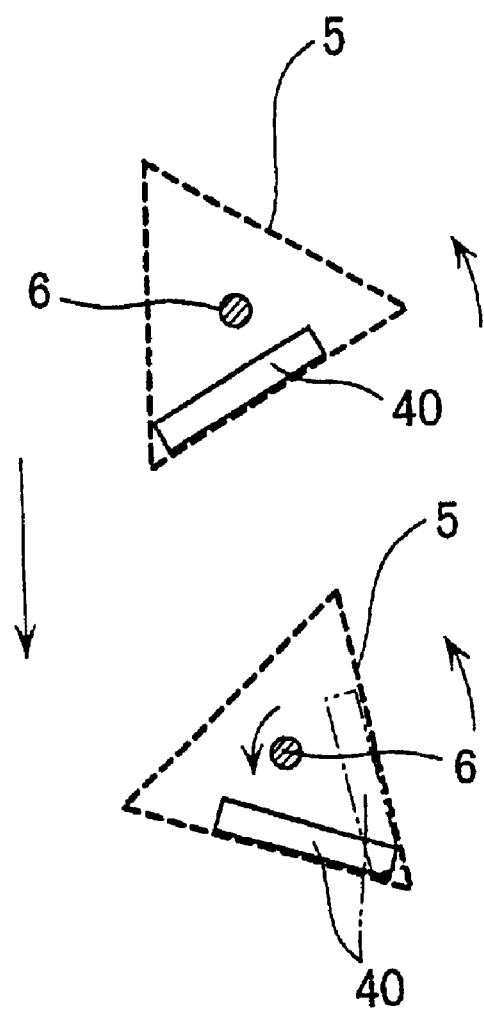
FIG. 1 is a schematic illustration of behavior of a work piece within a tubular barrel of an apparatus of the present invention.

A dry surface treating apparatus of the present invention comprises, within a treating chamber, a surface-treating material supply section and a tubular barrel having a porous peripheral surface for accommodating a work piece, to treat a surface of the work piece while rotating the tubular barrel horizontally arranged about a horizontal rotational axis, wherein the tubular barrel has a slide stop for stopping a slide of the accommodated work piece along an inner peripheral surface of the tubular barrel due to rotation of the tubular barrel.

The slide stop provided in the dry surface treating apparatus of the invention serves to stop the sliding of an accommodated work piece over an inner peripheral surface of the tubular barrel due to rotation of the tubular barrel, and efficiently causes it to invert of surfaces at that point as a fulcrum. It is accordingly possible to make equivalent the time the work piece at each surface faces the surface-treating material supply section. Consequently, the dry surface treating apparatus of the invention is suitably used as a deposition apparatus or blast treating apparatus because of the capability of providing even deposited-film forming or surface treatment to the respective surfaces of a work piece such as a plate or bow formed rare earth metal-based permanent magnet.

In the case of using the dry surface treating apparatus of the invention as a deposition apparatus, the treating chamber means a vacuum-treating chamber while the surface-treating material supply section means an evaporating section for a depositing material as a surface-treating material in this apparatus. The deposition apparatus may be an apparatus for film forming by a vacuum evaporation process or an apparatus for film forming by an ion plating process. The depositing materials include those of generally used metals and their alloys, e.g. aluminum, zinc, titanium, chromium, magnesium, nickel and alloys containing at least one component of these metal ingredients, and further ceramics such as aluminum oxide and titanium nitride. Among these, aluminum is suited for a rare earth metal-based permanent magnet as a work piece requiring a high adhesion strength because an aluminum film to be formed is excellent in corrosion resistance and further excellent in adhesion reliability with an adhesive required upon part assembling (peel-off is not liable to occur between the film and the adhesive before reaching a fracture strength the adhesive in nature possesses).

Where the dry surface treating apparatus of the invention is used as a blast treating apparatus, the surface-treating material supply section means an injection nozzle. For the blast material as a surface-treating material in this apparatus, a metal-based blast material such as steel shot or a non-metal-based blast material such as Alundum (product name, by Norton Co.) and glass beads is properly selected depending upon a purpose of treatment.

The porous peripheral surface provided in the tubular barrel may be anything provided that the surface-treating material can be reached to a work piece accommodated in the tubular barrel, including a mesh-formed peripheral surface as a representative thereof. The mesh-formed peripheral surface includes, for example, those made using a stainless-steel mesh net. The stainless-steel mesh net may be, for example, formed by a net-formed plate obtained by punching or etching a stainless steel plate, or formed by knitting stainless-steel linear members. Meanwhile, the porous peripheral surface may be a slit-formed peripheral surface. The slit-formed peripheral surface, for example, includes those made by arranging stainless-steel linear members in a stripe form with a gap. Furthermore, the porous peripheral surface maybe a grating-formed peripheral surface. The opening ratio of the porous peripheral surface (ratio in area of the opening to the entire peripheral surface), although depending on the form and size of a work piece, is desirably 50% to 95%, and more desirably 60% to 85%. If the opening ratio is smaller than 50%, the peripheral surface acts as a barrier between the surface-treating material supply section and the work piece resulting in a fear of lowering the treatment efficiency. If the opening ratio is greater than 95%, there is a fear that the peripheral surface be deformed or damaged upon treating or handling thereof. In addition, the thickness of the peripheral surface is selected with considerations to the opening ratio or strength thereof, and desirably 0.1 mm to 10mm. Further, more desirably 0.3 mm to 5 mm in consideration to easy handling.

The rotation of the tubular barrel about the horizontal rotational axis may be rotation about a rotating axis or revolution about a revolving axis. Also, it may be rotation about a rotating axis and at the same time revolution about a revolving axis.

The work piece, to be suitably treated by using the dry surface treating apparatus of the invention, is not especially limited provided that it requires deposited-film formation or surface treatment to the surface thereof. However, the dry surface treating apparatus of the invention is suitably applied for the treatment, particularly, of a rare earth metal-based permanent magnet in a plate or bow form, and more particularly of a large-sized magnet having a unit weight of 20 g or greater.

A first example of a dry surface treating apparatus of the invention includes a dry surface treating apparatus comprising, within a treating chamber, a surface-treating material supply section and a tubular barrel having a porous peripheral surface for accommodating a work piece, to treat a surface of the work piece while rotating the tubular barrel horizontally arranged about a horizontal rotational axis, wherein the tubular barrel has at least one corner at an internal angle of 30° to 100° in a vertical section with respect to a rotational axis thereof (e.g. a triangle, a square, a fan-shape or the like) to utilize the corner as a slide stop.

That is, with this dry surface treating apparatus, even if the work piece 40 slides on the barrel inner peripheral surface due to rotation of the tubular barrel 5 as shown in FIG. 1, the vertical section of the barrel with respect to the rotational axis 6 has at least one corner having an internal angle of 30° to 100° (regular triangle in FIG. 1) whereby the corner serves as a slide stop. The work piece is inverted of surfaces at that point as a fulcrum due to further rotation of the barrel. Because the movement of inversion of the piece is repeated by keeping the barrel rotation, the time the work piece at each surface faces the surface-treating material supply section is made equivalent thus making possible to provide even treatment to either surface. The corner herein means an angle formed by the adjacent two sides (tangential lines) providing a predetermined, or vertical sectional, form with respect to the rotational axis of the barrel. The corner may have a tip in various forms, such as round and chamfer, from a viewpoint of smoothing the movement of inversion of the work piece and facilitating the manufacture of the barrel.

The vertical section of the tubular barrel with respect to the rotational axis, preferably, is polygonal having at least three corners with an internal angle of 30° to 100°. More preferably, the form is polygonal having at least three corners with an internal angle of 55° to 95°. Particularly, the barrel having a triangular or rectangular section is well suited in respect of easy manufacture of the barrel. Furthermore, the barrel equal in angle at all the corners, e.g. the barrel having a section of a regular triangle or square, is particularly preferred because of capability of evenly, stably stopping the slide of the work piece at the corner and inverting the surfaces thereof at that point as a fulcrum. In the case that the length of the work piece is in relationship of equal to or greater than one-third of the one-side length of the polygon forming the section, the work piece can be efficiently inverted of surfaces at the corner, as a fulcrum, having an internal angle of 30° to 100°.

In addition, the tubular barrel having a vertical section with respect to the rotational axis of at least one corner of an internal angle of 30° to 100° may form an accommodating part having various outer-peripheral sections by a combination of them in a plurality with their side surfaces abutted one against another. In forming such an accommodating part, it is desired to give considerations to the outer-peripheral section so that homogeneous treatment can be made on the work pieces accommodated in all the tubular barrels (e.g. consideration of providing symmetry on left and right).

A second example of a dry surface treating apparatus of the invention includes a dry surface treating apparatus having, within a treating chamber, a surface-treating material supply section and a tubular barrel having a porous peripheral surface for accommodating work pieces so that the work pieces can be surface-treated while rotating the horizontally-arranged tubular barrel about a horizontal rotational axis, wherein the vertical section of the tubular barrel with respect to the rotational axis is partly curved in a convex form having slide stops at the opposite ends thereof. Such an apparatus concretely includes an apparatus having a tubular barrel having a vertical section in an elliptic or convex-lens form with respect to the rotational axis to have slide stops at the opposite ends thereof. By using a tubular barrel having a section having a convexly-curved portion such as an elliptic or convex-lens form, the contact area can be decreased between the inner peripheral surface of the tubular barrel and the work piece. This accordingly serves to suppress the work piece from being left with traces of the porous peripheral surface (traces of mesh net or the like). Meanwhile, the work piece can be inverted of surfaces with smoothness because of a broad interior space of the tubular barrel.

Figure 7:
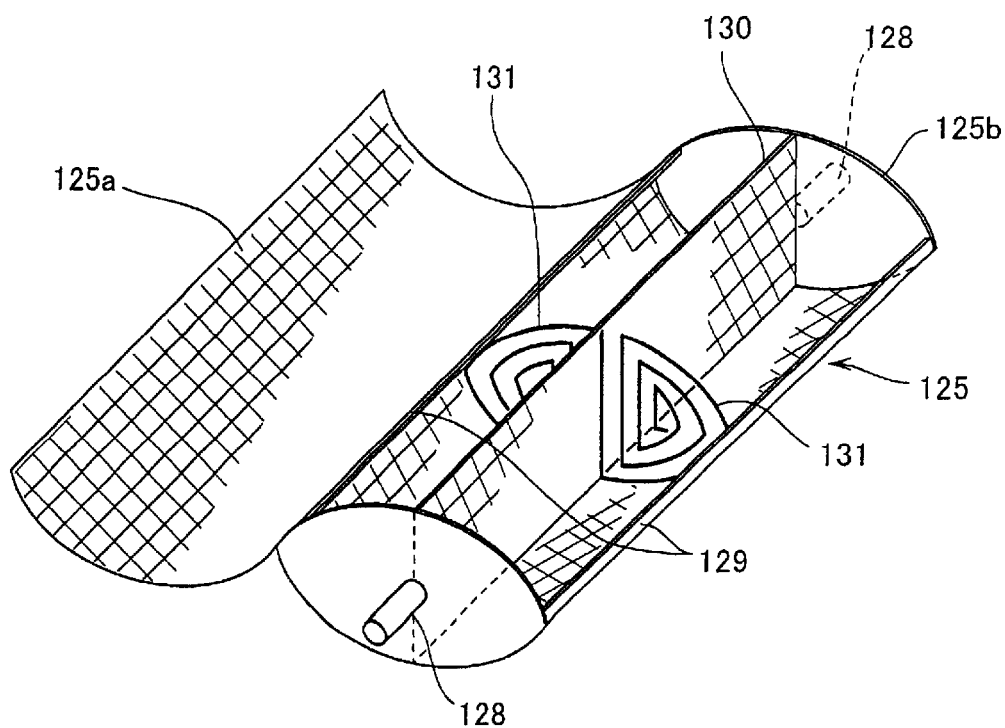
FIG. 7 is a diagrammatic perspective view of a tubular barrel used in the form shown in FIG. 6.

The foregoing tubular barrel in the first or second example of the dry surface treating apparatus of the invention is preferably made up by a plurality of partitioned accommodating sections formed by dividing the interior into two or more by partitioning members vertically provided with respect to a rotational axis of the tubular barrel. By accommodating the work pieces in the partitioned accommodating sections on a one-to-one basis thus formed to treat the work pieces in a state spaced from one another, the work pieces can be smoothly inverted of surfaces at the slide stops as fulcrums without causing dispersion in treatment due to overlap between the work pieces or breakage or cracks due to collision between them. The form of the partitioning member is not especially limited provided that the work piece accommodated in the partitioned accommodating section can be positively held therein, i.e. the partitioning member may be in a form having a single large opening. However, in the case of using such a partitioning member, there is a possibility that the work piece at its corner be caught in the opening and prevented from moving smoothly resulting in a failure of even surface treatment. On the other hand, where the partitioning member is made in a plate form, the partitioning member forms a barrier between the surface-treating material supply section and the working piece resulting in a possibility that surface treatment be insufficient for an end of a plate-formed work piece. Accordingly, the partitioning member is preferably in a form not liable to cause the foregoing possibility. Well suited is a porous form structured by linear members of stainless steel (e.g. those in a mesh net form, a slit form or a spiral form having a gap as shown in FIG. 7). In addition, the partitioning member may be made removable on the assumption that various forms of work pieces be treated with one tubular barrel. Each partitioned accommodating section need not accommodate one work piece, but the partitioned accommodating sections may accommodate work pieces on an equal number basis.

The foregoing tubular barrel in the first or second example of the dry surface treating apparatus of the invention is preferably made up by a plurality of partitioned chambers formed by dividing the interior into two or more in respect of the vertical section with respect to a rotational axis of the tubular barrel. The form of the formed partitioned chamber is, desirably, in a form that at least one corner having an internal angle of 30° to 100° is given in a vertical section with respect to the rotational axis to have a slide stop at the corner (e.g. regular triangle). By accommodating the work pieces in the formed partitioned chambers on a one-piece or small-amount basis, the work pieces can be smoothly inverted of surfaces at the slide stops as fulcrums while efficiently suppressing the occurrence of dispersion in treatment due to overlap between the work pieces or breakage or cracks due to collision between them. The partitions between the partitioned chambers are desirably in a mesh net form or a slit form, to enable efficient treatment onto the surface of a work piece facing the partition. Meanwhile, the partitions between the partitioned chambers desirably divide equivalent the tubular barrel in order to evenly treat the work pieces accommodated in all the partitioned chambers.

Figure 2:
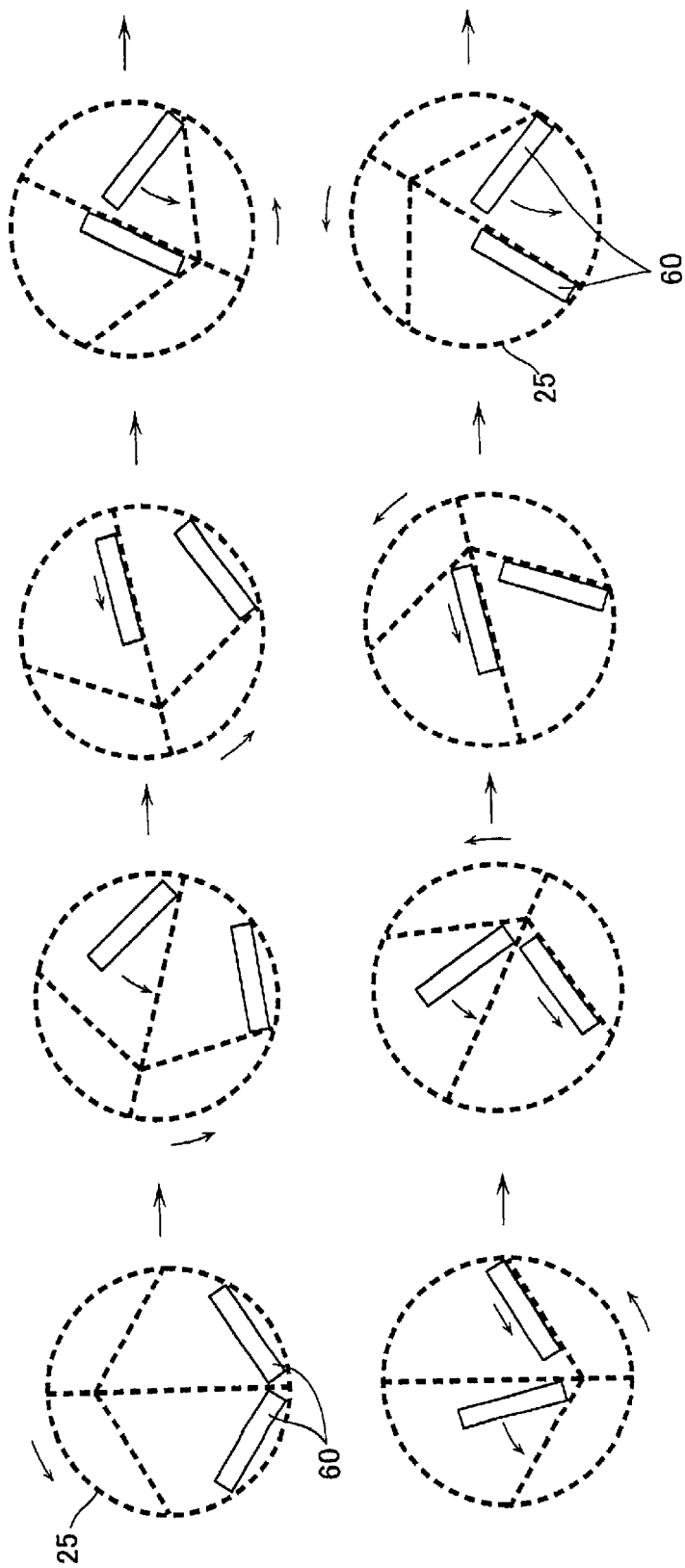
FIG. 2 is another schematic illustration of behavior of work pieces within the tubular barrel.

FIG. 2 shows the behavior of the work piece in an example of treating the work piece by use of the tubular barrel formed with partitioned chambers therein. The use of the cylindrical barrel 25 as shown in FIG. 2 allows for efficient surface-inversion without causing breakage or cracks in the work piece 60. Furthermore, because the contact area is reduced with the work piece in an inner peripheral surface of the cylindrical barrel, it is possible to suppress the work piece from being left with traces of the porous peripheral surface (traces of mesh net or the like).

FIG. 3 shows the behavior of the work piece in another example of treating the work piece by use of the tubular barrel formed with partitioned chambers therein. The use of the tubular barrel 35 having a vertical section in the form of a convex lens with respect to the rotational axis, as shown in FIG. 3, allows for efficient surface-inversion without causing breakage or cracks in the work piece 70. Furthermore, because the contact area is reduced with the work piece in a convex curved portion of the vertical section of the tubular barrel with respect to the rotational axis, it is possible to suppress the work piece from being left with traces of the porous peripheral surface (traces of mesh net or the like).

The following apparatus is included as a concrete apparatus for forming an aluminum deposited film on a flat or bow-formed surface of a rare earth metal-based permanent magnet by the use of the foregoing first or second example of the dry surface treating apparatus as a deposition apparatus.

Figure 13:
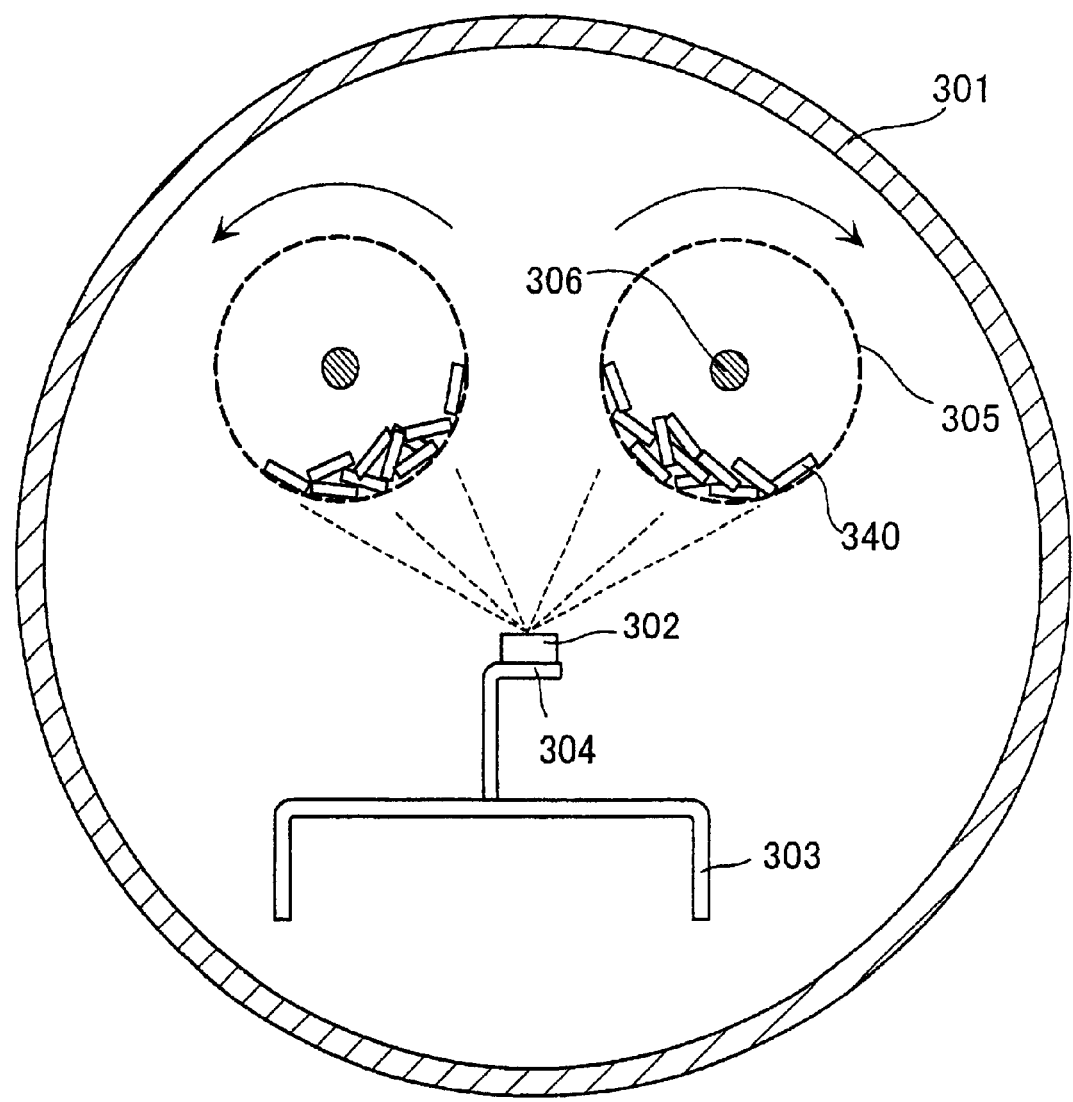
FIG. 13 is a diagrammatic front view of an interior of a vacuum-treating chamber in a related art deposition apparatus.
Figure 14:
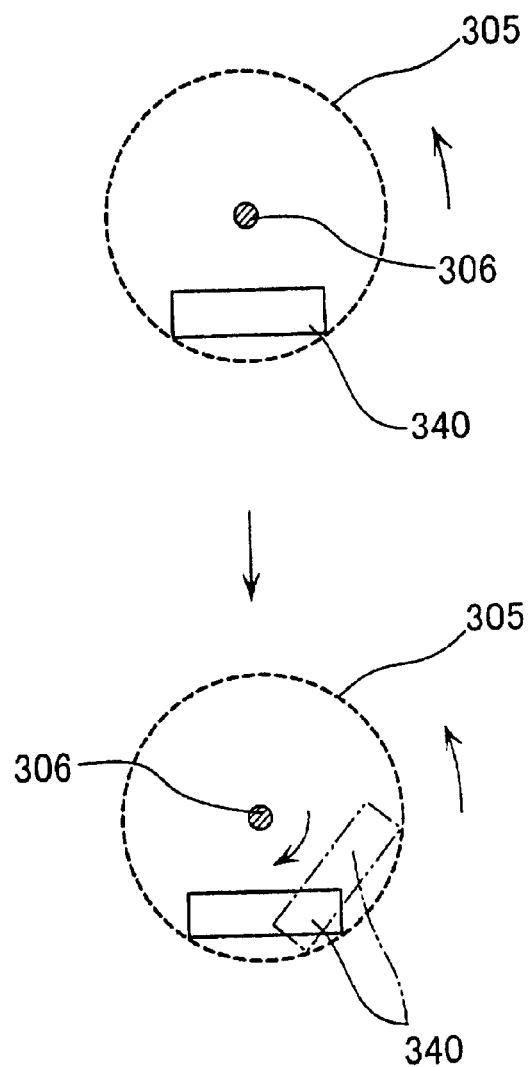
FIG. 14 is a schematic illustration of behavior of a work piece within the cylindrical barrel in the related art deposition apparatus.

For example, there is included an apparatus that, in the foregoing deposition apparatus shown in FIG. 13, a tubular barrel having a regular-triangular vertical section with respect to the rotational axis shown in FIG. 1 is provided, in place of the cylindrical barrel shown in FIG. 13. By rotating the tubular barrel 5 about the rotational axis 6, the magnet 40 is caught in a corner of the tubular barrel and inverted of surfaces here with a fulcrum due to further rotation of the barrel. Because the inversion motion of the magnet is repeated by keeping the barrel rotation, the time the magnet at each surface faces the evaporating section is made equal thereby forming an even deposited film on either surface.

The deposition apparatus shown in FIG. 4 is an apparatus with another structure. FIG. 4 is a diagrammatic front view (a partially perspective view) of an inside of a vacuum-treating chamber 51 of the same. This apparatus has two support members 57 juxtaposed, for rotation about a horizontal rotational axis 56, in an upper region of the vacuum-treating chamber 51 connected to an evacuating system, not shown. The support member has, at a circumferentially outward of the rotational axis of the support member, six tubular barrels 55 which are formed by mesh net of stainless steel having a regular-triangular vertical section with respect to the rotational axis and annularly supported for revolution by respective support shafts 58. Meanwhile, in the lower region of the chamber, a plurality of boats 52, which are evaporating sections for evaporating aluminum as a depositing material, are disposed on a boat support base 54 risen on a support table 53.

At a lower inside of the support table 53, an aluminum wire 59 as a depositing material is held by winding on a feed reel 60. The aluminum wire 59 has a tip guided at the above of the boat 52 by a heat-resisting protection tube 61 directed toward an inner surface of the boat 52. The protection tube 61 has a notched window 62 in a part thereof. A feed gear 63 provided correspondingly to the notched window 62 is in direct contact with the aluminum wire 59 so that aluminum can be uninterruptedly supplied into the boat 52 by feeding the aluminum wire 59.

By rotating the support member 57 about the rotational axis 56 (see the arrow in FIG. 4), the tubular barrels 55 supported on the support shafts 58 at the circumferentially outward of the rotational axis 56 of the support member 57 revolve about the rotational axis 56 correspondingly. As a result, even if the magnet 90 slides over a barrel inner peripheral surface due to the rotation of the tubular barrel 55, the magnet is caught in a corner of the tubular barrel. Due to further rotation of the barrel, the magnet is inverted of surfaces at this point as a fulcrum. Because the inversion of the magnet is repeated by keeping the barrel rotation, the time the magnet at each surface faces the evaporating section is made equal. Furthermore, according to the apparatus, the magnet surfaces facing before revolution and after one revolution to the evaporating section are exchanged in a position the barrel is the closest to the evaporating section or in the most efficient deposition position. Accordingly, it is possible to form an even deposited film on either surface.

Meanwhile, in this apparatus, the rotation of the support member 57 about the rotational axis 56 changes the distance between the individual tubular barrel and the evaporating section placed beneath the support member, thus exhibiting the following effect.

That is, the tubular barrel positioned lower in the support member 57 is close to the evaporating section. Consequently, aluminum deposited film is efficiently formed on a surface of the magnet 90 accommodated in that tubular barrel. On the other hand, the magnet accommodated in the tubular barrel far from the evaporating section is released from a heated state and cooled to an extent corresponding to a distance from the evaporating section. Consequently, in this duration, the aluminum deposited film formed on the surface of the magnet is suppressed from softening thereby suppressing the damage to the film caused due to slide of the magnet over the inner peripheral surface of the tubular barrel. In this manner, the use of the deposition apparatus can simultaneously achieve the efficient formation of an aluminum deposited film and the suppression of the damage to the aluminum deposited film, thus forming more even deposited films on the respective surfaces of the magnet.

The deposition apparatus shown in FIG. 4A exhibits the above effects and is convenient in respect of providing the below advantage.

That is, where simultaneously treating a plurality of magnets, the divisional accommodation of them in the tubular barrels of the apparatus reduces the frequency of collisions between the magnets within the barrel thus making possible to suppress the occurrence of breakage or cracks in the magnets. Also, in the conventional there have been cases of using dummies (e.g. including ceramics balls having a diameter of 10 mm) to be accommodated together with magnets within the barrel in order to reduce the frequency of collisions between the magnets. However, this necessity is to be eliminated by the use of this apparatus thereby making possible to improve magnet film-forming efficiency. Meanwhile, it is possible to omit labor and time required in accommodating the magnet in a magnet protection holder (e.g. a linear member is wound with gaps to form into a spring-formed cylindrical member having spiral linear surfaces at both ends, to accommodate the magnet in the cylindrical body). Furthermore, if the tubular barrel is made in a size of easy for handling and removably mounted on the deposition apparatus so that the barrel can be consistently used in the deposited film forming process and the preceding and succeeding processes thereof (e.g. the preceding process includes a blast treating process and the succeeding process includes a peening process and a thereafter chemical conversion film forming process), there is no need of loading and unloading the magnet during the processes. This accordingly makes it possible to suppress against the breakage or cracks to be caused upon transferring the magnet and further eliminate labor and time.

Figure 4A:
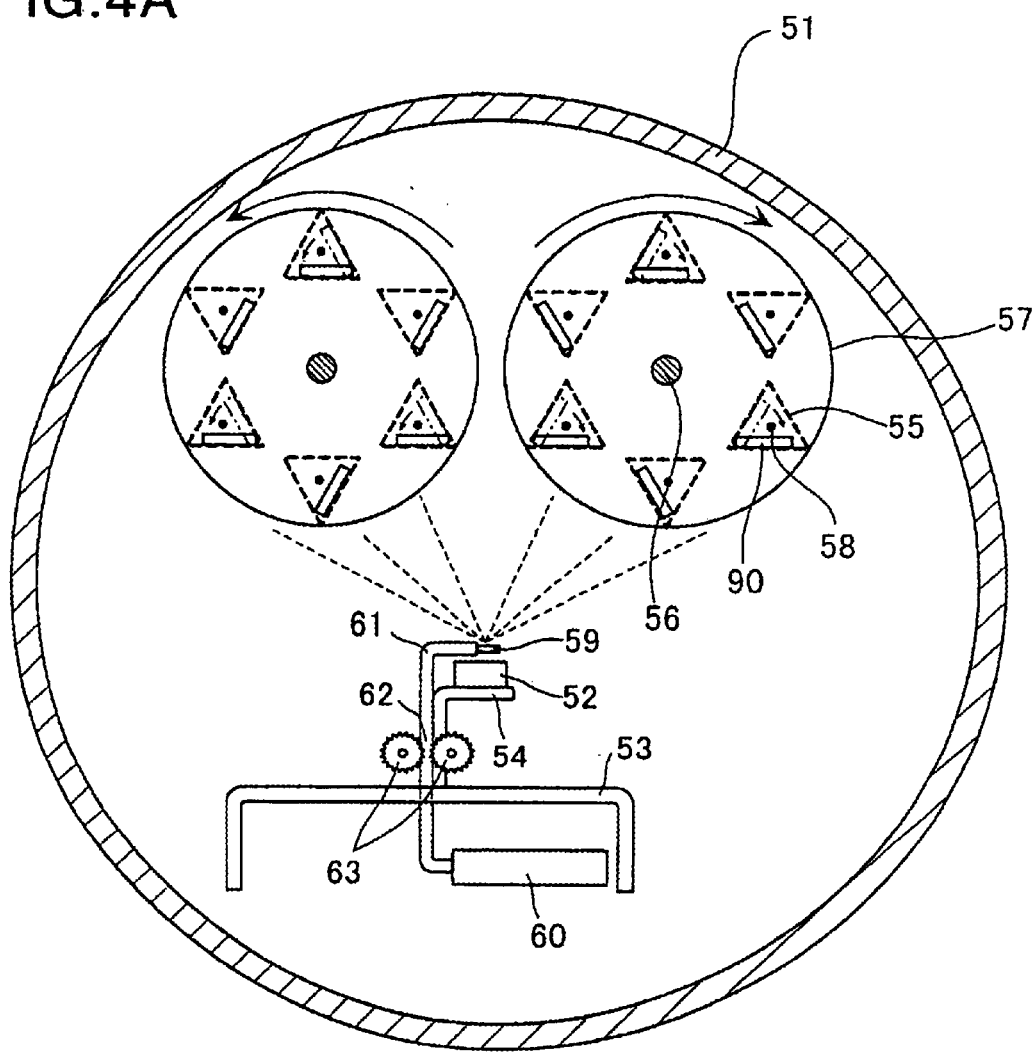
FIG. 4A is a diagrammatic front view of an interior of a vacuum-treating chamber in a use example as a deposition apparatus and FIGS. 4B and 4C show alternate shapes of a tubular barrel.

In addition, there is shown in the deposition apparatus of FIG. 4A a structure that the support members 57 supporting the tubular barrels 55 are disposed in the upper region of the vacuum-treating chamber 51 while the boat 52 as an evaporating section is in the lower region of the chamber, i.e. a structure for deposition in one way toward the work pieces. However, the relationship between the support member and the evaporating section is not limited to this structure. It is preferred to properly determine the positional relationship or the number depending upon a work-piece treating amount and film forming condition.

Figure 4B:
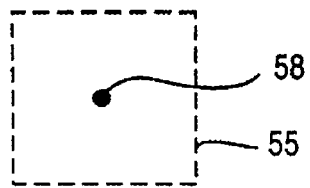
Figure 4C:
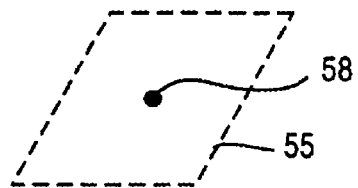

Although the deposition apparatus shown in FIG. 4A has six tubular barrels 55 supported in one support member 57, the number of tubular barrels supported in the support member is not limited to that, i.e. one in the number is satisfactory. Furthermore, as shown in FIGS. 4B and 4C, the shape of the tubular barrel can be a square or a rhombus, respectively.

Meanwhile, the tubular barrels 55 may be supported such that they are revolved about the rotational axis 56 of the support member 57 by rotation of the support member 57 and rotated themselves by a known mechanism.

Figure 5:
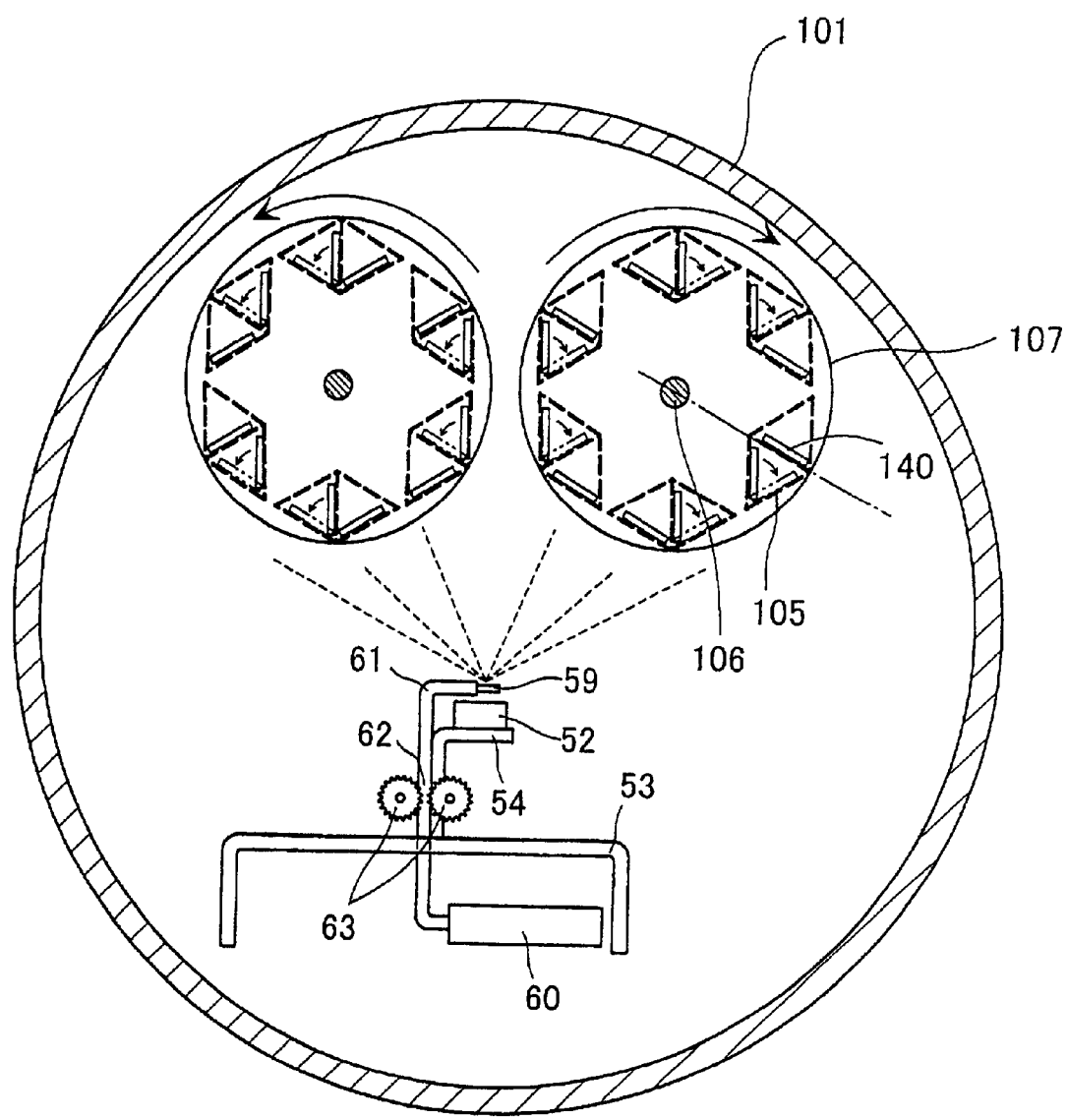
FIG. 5 is a diagrammatic front view of an interior of a vacuum-treating chamber in another use example as a deposition apparatus.

The deposition apparatus shown in FIG. 5 is an apparatus with another structure. FIG. 5 is a diagrammatic front view (a partially perspective view) of an inside of a vacuum-treating chamber 101 of the same. This apparatus has two support members 107 juxtaposed, for rotation about a horizontal rotational axis 106 in an upper region of the vacuum-treating chamber 101 connected to an evacuating system, not shown. In the circumferential outward of the rotational axis of the support member, six tubular barrels 105 formed by mesh net of stainless steel having a rhombic vertical section with respect to the rotational axis are detachably attached in view of well handling thereof The rhombic tubular barrel 105 has an interior divided symmetrically left and right into two by a partition formed by stainless-steel mesh net, to form partitioned chambers regular-triangular in vertical section with respect to the rotational axis. In order to provide even deposition treatment to the magnets 140 accommodated in the left and right partitioned chambers, the left and right partitioned chambers are partitioned by a partition in a positional relationship having a rotational axis 106 on an extension between them (see the one-dot chain line in FIG. 5). In addition, the structure in the lower region of the chamber interior is similar to that of the deposition apparatus shown in FIG. 4A. By rotating the support member 107 about the rotational axis 106 (see the arrow in FIG. 5) it is possible to obtain an effect similar to that of the deposition apparatus shown in FIG. 4A.

Figure 6:
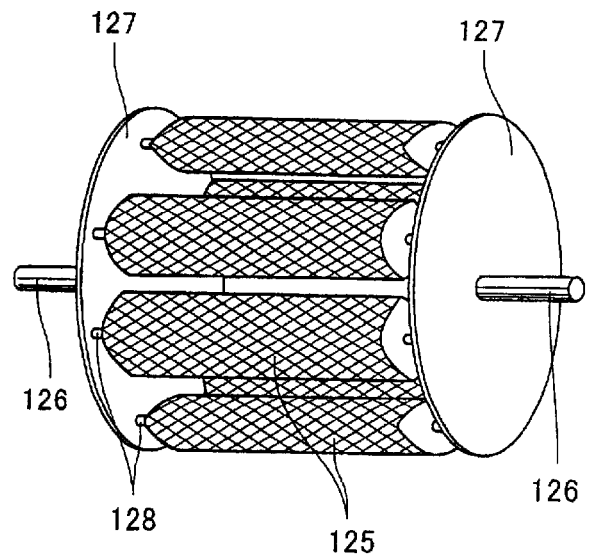
FIG. 6 is a diagrammatic perspective view showing a form of tubular barrels supported on a support member.

FIG. 6 is a diagrammatic perspective view showing another form of a tubular barrel supported on the support member. In the circumferential outward of the horizontal rotational axis 126 of the support member 127 provided rotatable about the rotational axis 126, six tubular barrels 125 formed by stainless-steel mesh net having a vertical section of a convex lens with respect to the rotational axis are annularly supported for revolution by respective support shafts 128.

FIG. 7 is a diagrammatic perspective view of the tubular barrel 125 having a vertical section of a convex lens with respect to the rotational axis to be used in the form shown in FIG. 6. The tubular barrel 125, to be opened and closed along a lengthwise direction, is made up by a lid 125a and a cage 125b structured for open and close through hinges, not shown, to have a support shaft 128 for supporting the barrel in the support member 127. Because the use of such a tubular barrel 125 facilitates the insertion and removal of work pieces, it is possible to suppress the work pieces from breakage or cracks upon insertion and removal thereof In addition, where such a tubular barrel 125 is continuously used, there is a fear that a gap occurs between the lid 125a and the cage 125b due to deformation of the mesh net forming the barrel by the affection of thermal hysteresis in the deposition treatment thus resulting in falling off of the work pieces through the gap. It is accordingly preferred to attach a work-piece-fall preventing plate 129 to the cage 125b in a lengthwise direction of an opening thereof (the work-piece-fall preventing plate 129 maybe attached to the lid 125a in a lengthwise direction of the opening thereof). During deposition treatment, the lid 125a and the cage 125b are fastened and used with a clip not shown. The interior of the tubular barrel 125 is divided symmetrically left and right into two to form partitioned chambers. The partition 130 between the partitioned chambers is formed by stainless-steel mesh net. The partitioned chamber is divided into two by a spiral partitioning member 131 provided vertical to the rotational axis and formed by a stainless-steel linear member to have a gap therein. If work pieces are accommodated in the formed partitioned accommodation sections on a one-to-one basis to carry out deposition treatment to the work pieces in a spaced state, the work pieces can be smoothly inverted of surfaces at the slide stops as fulcrums without causing dispersion in deposition due to overlap between the work pieces or breakage or cracks due to collision between them. In addition, the lid 125a and the cage 125b maybe structured completely separated without connection to be used by clip fastening when necessary instead of connection through the hinges, from the viewpoint of securing easy insertion and removal of work pieces and easy attachment and detachment of the partition 130 or spiral partitioning member 131.

Figure 8:
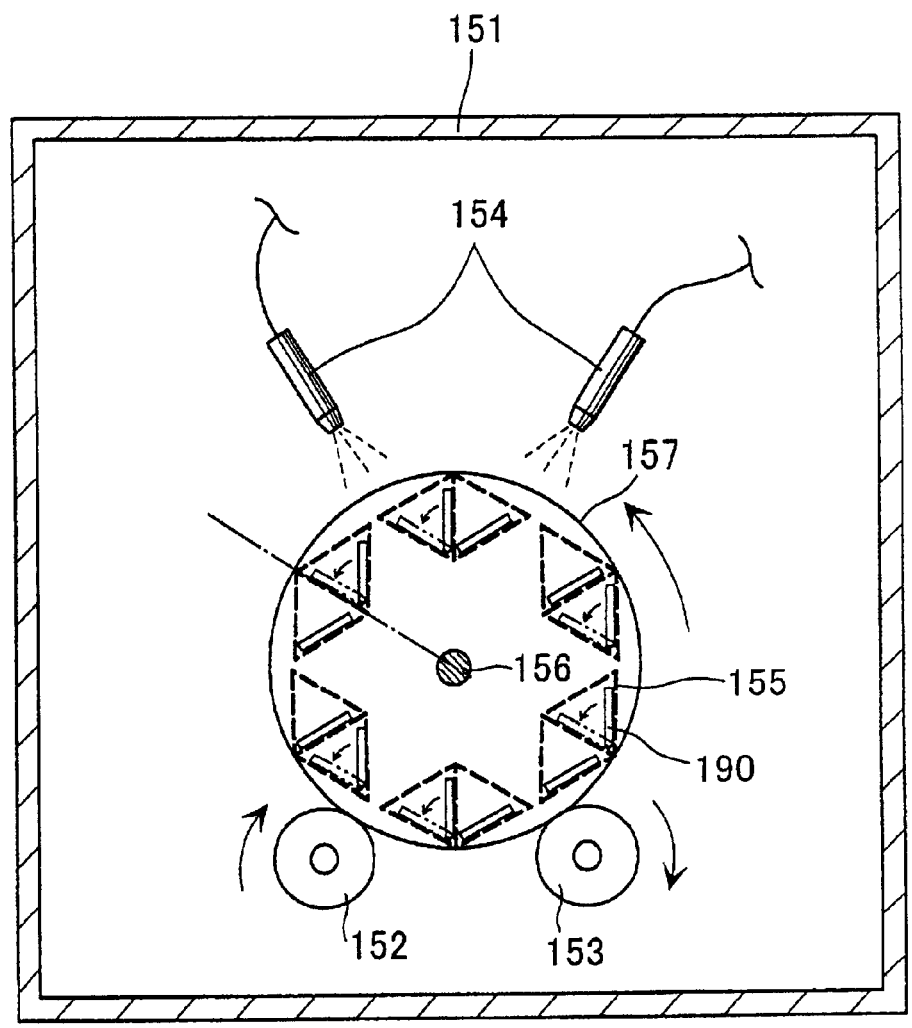
FIG. 8 is a diagrammatic front view of an interior of a treating chamber in a use example as a blast treating apparatus.

The concrete apparatus, using the first or second dry surface treating apparatus as a blast treating apparatus to work the surface of a plate or bow-formed rare earth metal-based permanent magnet, includes an apparatus shown in FIG. 8, for example.

FIG. 8 is a diagrammatic front view (a partially perspective view) of an inside of a blast-working-apparatus treating chamber 151. In the lower region of the treating chamber, a support member 157 is supported for rotation on rollers 152, 153 about a rotational axis 156. In the circumferential outward of the rotational axis of the support member, six tubular barrels 155 formed by stainless-steel mesh net having a vertical section of a rhombus with respect to the rotational axis are detachably attached in view of well handling thereof. The rhombic tubular barrel 155 has an interior divided symmetrically left and right into two by a partition formed by stainless-steel mesh net, thereby forming partitioned chambers having a vertical section of regular triangles with respect to the rotational axis. In order to carry out even treatment to the magnets 190 accommodated in the left and right partitioned chambers, the left and right partitioned chambers are partitioned by a partition in a positional relationship having a rotational axis 156 on an extension between them (see the one-dot chain line in FIG. 8). In the upper region of the treating chamber, two injection nozzles 154 are arranged at a proper injection angle to inject a blast material to the magnets 190 in the barrel.

When the support member 157 is rotated about the rotational axis 156 by rotating the rollers 152, 153 due to the rotation of the motor, not shown, the rhombic tubular barrels 155 correspondingly revolve about the rotational axis 156. As a result, even if the magnet 190 slides on the barrel inner peripheral surface due to rotation of the tubular barrel 155, the magnet is caught in a corner of the tubular barrel. The magnet is inverted of surfaces at this point as a fulcrum due to further rotation of the barrel. Because the inversion motion of the magnet is repeated by keeping the barrel rotation, the time the magnet at each surface faces the injection nozzle is made equivalent. Furthermore, according to this apparatus when the barrel is in a position closest to the injection nozzle and hence maximum in work efficiency, the surface of the magnet facing the injection nozzle is exchanged in a duration of between before revolution and after one revolution thereby providing even surface treatment onto the both surfaces (see the arrow).

In addition, the number and arrangement way of the injection nozzles are not limited to the form of the blast treating apparatus shown in FIG. 8.

A third example of a dry surface treating apparatus of the invention includes an apparatus having, in a treating chamber, a surface-treating material supply section and a tubular barrel having a porous peripheral surface to accommodate a work piece wherein the work piece can be surface-treated while rotating the tubular barrel horizontally arranged about a horizontal rotational axis and a protrusion is provided on an inner peripheral surface of the tubular barrel to use the protrusion as a slide stop.

Figure 9:
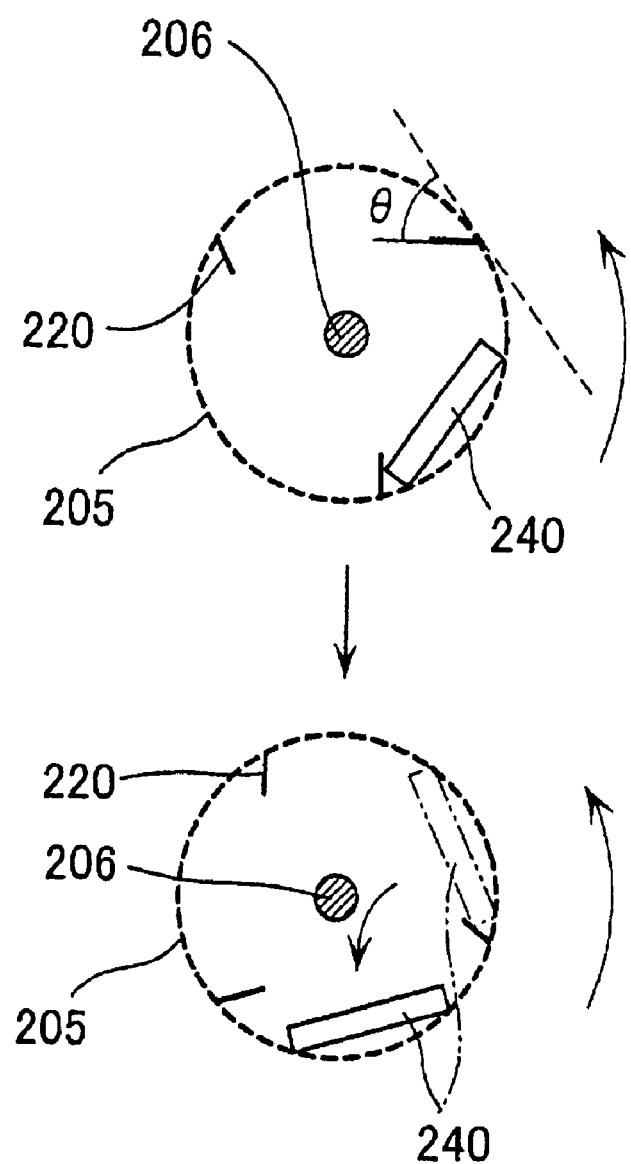
FIG. 9 is another schematic illustration of behavior of a work piece within the tubular barrel.

That is, according to this dry surface treating apparatus, even if the work piece 240 slides on a barrel inner peripheral surface due to rotation of the tubular barrel 205 as shown in FIG. 9, the protrusion 220 on the barrel inner peripheral surface serves as a slide stop. Due to further rotation of the barrel, the work piece is inverted of surfaces at this point as a fulcrum. Because the inversion motion of the work piece is repeated by keeping the barrel rotation, the time the work piece at each surface faces the surface-treating material supply section is made equivalent thereby making possible to provide even treatment on the both surfaces.

The protrusion serving as a slide stop is desirably provided on the inner peripheral surface of the tubular barrel at an angle of 30° to 100° (θ in FIG. 9) to the tangential line on the forward side of rotation in the vertical section with respect to the rotational axis of the tubular barrel.

The tubular barrel having the protrusion on the inner peripheral surface is not especially limited in its shape but may be a cylindrical barrel as shown in FIG. 9. Or otherwise, it may be a tubular barrel in a form having at least one corner at an internal angle of 30° to 100° as in a vertical section to the rotational axis of a triangle, square or fan-shape to have the corner as a slide stop, or an tubular barrel in a form having a vertical section to the rotational axis partly curved in a convex form as in an elliptic or convex-lens form to have both ends as slide stops.

The form of the protrusion provided on the inner peripheral surface of the tubular barrel is preferably in any of the comb, plate and rod forms in view of weight reduction. The number of the protrusions, although depending on a size of the barrel or work piece, a barrel rotational velocity and the like, is desirably 1 to 7 in order for efficient inversion of surfaces of the work piece, and more desirably three or five. In order to efficiently surface-invert the work piece, the protrusion is more desirably provided on the inner peripheral surface of the tubular barrel at an angle of 55° to 95° (θ in FIG. 9) to the tangential line on the forward side of rotation in the vertical section with respect to the rotational axis of the tubular barrel. Meanwhile, in the case where the work piece has a length of twice or more a protruding length of the protrusion, where a plurality of protrusions are provided or where the work piece has a relationship in length of one-third or greater of a line distance between the adjacent protrusions, the work piece can be efficiently inverted of surfaces at the protrusion as a fulcrum.

The tubular barrel of the third example of the dry surface treating apparatus of the invention is similar to that of the first or second example of the dry surface treating apparatus in that a plurality of partitioned accommodating sections are desirably provided by dividing the interior into two or more by partitioning members vertically provided with respect to the rotational axis of the tubular barrel.

The tubular barrel of the third example of the dry surface treating apparatus of the invention is also similar to that of the first or second example of the dry surface treating apparatus in that a plurality of partitioned chambers are desirably provided by dividing the interior into two or more in the vertical section with respect to the rotational axis of the tubular barrel. In this case, it is desired that at least one protrusion exists in the interior of each partitioned chamber. Meanwhile, the presence of the partition between the partitioned chambers forms corners in the partitioned chambers whereby the corners serve as slide stops. In this case, it is desired that the total number of the protrusions and slide stops is three or five.

The following apparatus is included as a concrete apparatus using the third example of the dry surface treating apparatus as a deposition apparatus to form an aluminum deposited film on a surface of a rare earth metal-based permanent magnet in a plate or bow form.

For example, there is included an apparatus that, in the foregoing deposition apparatus shown in FIG. 13, a cylindrical barrel having a protrusion on an inner peripheral surface shown in FIG. 9 is provided, in place of the cylindrical barrel shown in FIG. 13. By rotating the cylindrical barrel 205 about the rotational axis 206, the magnet 240 is caught by the protrusion 220 and then inverted of surfaces at this point as a fulcrum due to further barrel rotation. Because the inversion motion of the magnet is repeated by keeping the barrel rotation, the time the magnet at each surface faces the evaporating section is made equivalent thereby forming an even deposited film on either surface.

Figure 10:
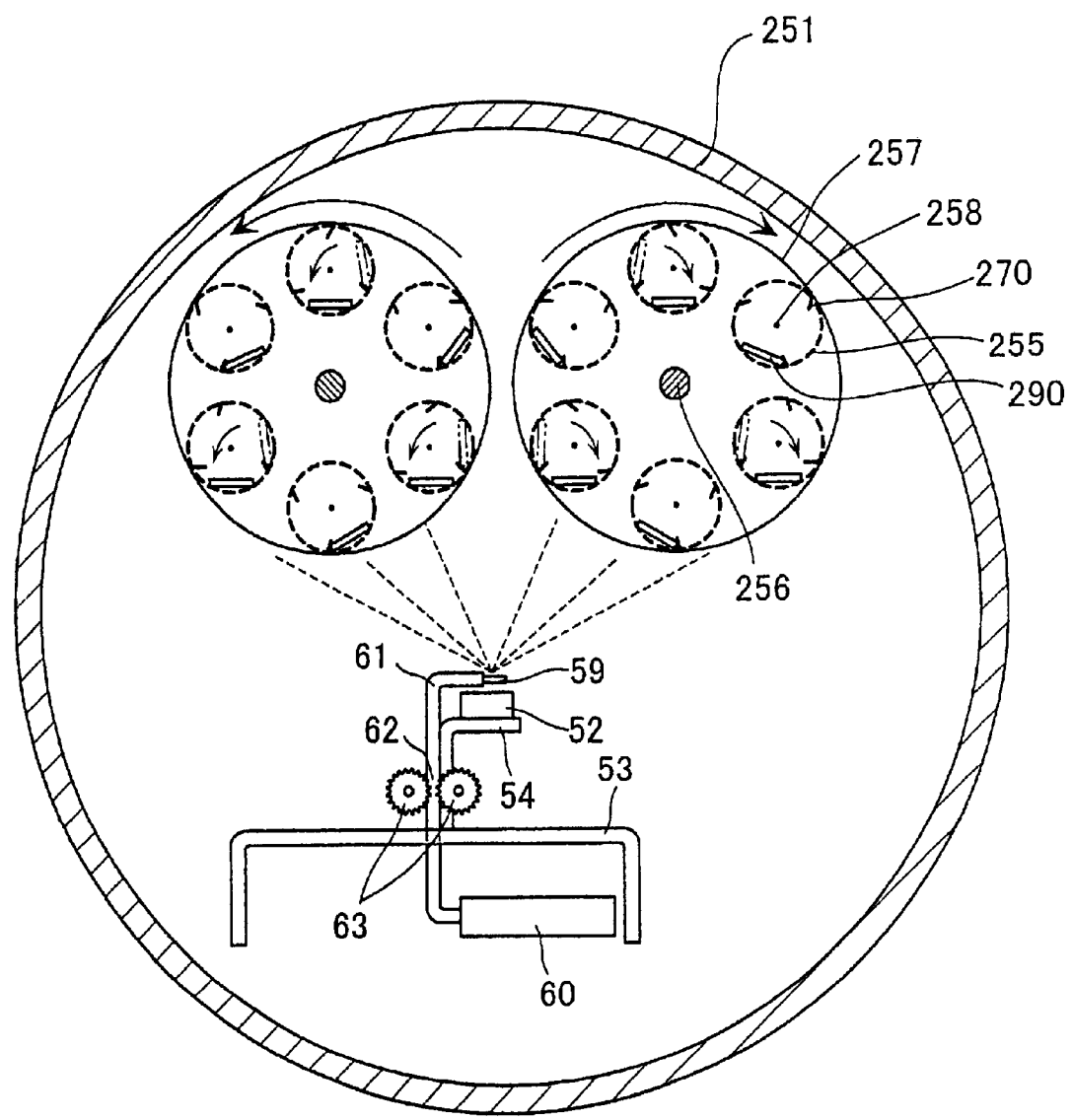
FIG. 10 is a diagrammatic front view of an interior of a vacuum-treating chamber in another use example as a deposition apparatus.

The deposition apparatus shown in FIG. 10 is an apparatus having another structure. FIG. 10 is a diagrammatic front view (a partially perspective view) of an inside of a vacuum-treating chamber 251 thereof. This apparatus has two support members 257 juxtaposed, for rotation about a horizontal rotational axis 256, in an upper region of the vacuum-treating chamber 251 connected to an evacuating system, not shown. In the circumferential outward of the rotational axis of the support member, six cylindrical barrels 255 formed by stainless-steel mesh net are annularly supported for revolution by respective support shafts 258. Each cylindrical barrel 255 has three protrusions 270 provided on an inner peripheral surface of the cylindrical barrel at an angle of 60° (θ in FIG. 9) to the tangential line on the forward side of rotation. In addition, the structure in the lower region of the chamber is similar to that of the deposition apparatus shown in FIG. 4. It is possible to obtain an effect similar to that of the deposition apparatus shown in FIG. 4 by rotating the support member 257 about the rotational axis 256 (see the arrow in FIG. 10).

The concrete apparatus using the foregoing dry surface treating apparatus as a blast treating apparatus to work the surface of a rare earth metal-based permanent magnet in a plate or bow form includes for example an apparatus having, in the apparatus of FIG. 8, a cylindrical barrel having protrusions on the inner peripheral surface of the apparatus of FIG. 10, in place of the tubular barrel having a rhombic vertical section with respect to the rotational axis.

EXAMPLES

The below experimental examples 1 and 2 (comparative examples 1 and 2) were conducted using sintered-magnet test pieces each having a composition of $Nd_{14}Fe_{79}B_6Co_1$ and dimensions of 45 mm×30 mm×5 mm with a unit weight 50.6 g obtained by pulverizing a known cast ingot and then subjecting the resulting powder to a pressing, a sintering, a heat treatment and a surface working, for example, as in a manner described e.g. in U.S. Pat. No. 4,770,723 or U.S. Pat. No. 4,792,368. Also, the below experimental examples 3 to 5 were conducted using the sintered-magnet test pieces each having a composition of $Nd_{14}Fe_{79}B_6Co_1$ and dimensions of 45 mm×35 mm×6 mm with a unit weight 70.9 g obtained in the method similar to the above.

Example 1

The following experiment was conducted by using the deposition apparatus shown in FIG. 5. Herein, the tubular barrel having a rhombic vertical section with respect to the rotational axis is formed of stainless steel (thickness of 0.6 mm) having an opening ratio of a mesh of 70%, to have dimensions of 50 mm in one side×600 mm in length. The partitioned chamber having a regular-trianglar vertical section with respect to the rotational axis is divided into ten by the mesh-net partitioning members (made by the use of stainless-steel linear members) provided vertical to the rotational axis.

A shot blasting was made to the magnet test pieces in order to remove the oxidation layer on the surface of each test piece formed in the preceding surface treatment. The magnet test pieces removed of the oxidation layer were accommodated in the partitioned accommodating sections (totally 240 magnet test pieces were accommodated in the entire apparatus) on a one-to-one basis. After vacuum-evacuating the vacuum-treating chamber down to $1×10^{-3}$ Pa or below, a spattering was made onto the surfaces of the magnet test pieces under a condition of an Ar gas pressure of 1 Pa and a bias voltage of −500V for 20 minutes to clean the surfaces of the magnet test pieces while rotating the support members at 1.5 rpm. Subsequently, an aluminum wire used as a depositing material was heated up and evaporated for ionization under a condition of an Ar gas pressure of 1 Pa and a bias voltage of −100V, thereby forming an aluminum deposited film on the surface of the magnet test piece by the ion plating process for 12 minutes.

After cooling the magnet test pieces, ten magnet test pieces arbitrarily selected were measured as to a film thickness of the aluminum deposited film formed on the both surfaces of 45 mm×30 mm, a result of which is shown in Table 1. In addition, the measurement of the aluminum deposited film thickness was made by the use of a fluorescence X-ray thickness-meter (SFT-7000 by Seiko Instruments and Electronics, Ltd.).

Comparative Example 1

The following experiment was conducted by the use of an apparatus having a cylindrical barrel mounted in the deposition apparatus used in Example 1, in place of the tubular barrel having the rhombic vertical section with respect to the rotational axis. The cylindrical barrel herein is formed of stainless steel (thickness of 0.6 mm) having an opening ratio of a mesh of 70%, to have dimensions of 110 mm in diameter×600 mm in length. The interior is divided into ten by the mesh-net partitioning members (made by the use of stainless-steel linear members) provided vertical to the rotational axis.

A shot blasting was made to the magnet test pieces in order to remove the oxidation layer on the surface of each test piece formed in the preceding surface treatment. The magnet test pieces removed of the oxidation layer were accommodated in the partitioned accommodating sections (totally 120 magnet test pieces were accommodated in the entire apparatus) on a one-to-one basis. An aluminum deposited film was formed on the surface of each magnet test piece under the same condition as that of Example 1. After cooling the magnet test pieces, ten magnet test pieces arbitrarily selected were measured as to a film thickness of the aluminum deposited film formed on the both surfaces of 45 mm×30 mm, a result of which is shown in Table 1.

TABLE 1

| | EXAMPLE 1 | | | COMPARATIVE EXAMPLE 1 | |
|---|---|---|---|---|---|
| MAGNET NO. | SURFACE A | SURFACE B | MAGNET NO. | SURFACE A | SURFACE B |
| 1 | 7.16 | 7.35 | 1 | 4.15 | 9.35 |
| 2 | 6.51 | 8.16 | 2 | 7.18 | 7.36 |
| 3 | 8.37 | 6.73 | 3 | 5.35 | 8.76 |
| 4 | 6.10 | 8.76 | 4 | 10.05 | 3.17 |
| 5 | 9.01 | 6.02 | 5 | 8.20 | 6.58 |
| 6 | 7.35 | 7.67 | 6 | 10.51 | 3.05 |
| 7 | 8.21 | 7.01 | 7 | 9.01 | 5.37 |
| 8 | 6.92 | 7.38 | 8 | 4.78 | 10.01 |
| 9 | 7.55 | 8.00 | 9 | 6.26 | 8.87 |
| 10 | 7.89 | 6.56 | 10 | 7.73 | 7.14 |
| AVERAGE VALUE | 7.51 | 7.36 | AVERAGE VALUE | 7.32 | 6.97 |
| STANDARD DEVIATION | 0.89 | 0.82 | STANDARD DEVIATION | 2.18 | 2.46 |

As apparent from Table 1, in Example 1 the time the magnet test piece at each surface faces the evaporating section was made equivalent by forming a deposited film while surface-inverting the magnet test piece within the partitioned accommodating section, thereby making possible to form an even aluminum deposited film on either surface. In Comparative Example 1, on the other hand, there occurred a large dispersion in the thickness between the aluminum deposited films formed on the respective surfaces.

Example 2

The following experiment was conducted by using the blast treating apparatus shown in FIG. 8. Herein, the tubular barrel having a rhombic vertical section with respect to the rotational axis is formed of stainless steel (thickness of 0.7 mm) having an opening ratio of a mesh of 70%, to have dimensions of 50 mm in one side×600 mm in length. The partitioned chamber having a regular-trianglar vertical section with respect to the rotational axis is divided into ten by the mesh-net partitioning members (made by the use of stainless-steel linear members) provided vertical to the rotational axis.

Using the deposition apparatus described in Example 1, the magnetic test pieces formed with the aluminum deposited films on the surfaces by the method described in Example 1 were accommodated in the partitioned accommodating sections (totally 120 magnet test pieces were accommodated in the entire apparatus) on a one-to-one basis. While rotating the support member at 2.5 rpm, GB-AG (product name and made by Sinto Brator Co., glass beads material equivalent to JIS particle size #180) as a blast material was injected to the magnet test piece under an injection pressure of 0.2 Mpa for 10 minutes, and hence, a shot peening was done for finishing. Thereafter, surface observation with an electron microscope (×800) was conducted on the both surfaces of 45 mm×30 mm of the ten magnetic test pieces arbitrarily selected, to compute an area subjected to peening for each surface. As a result, the time the magnetic test piece at each surface faces the injection nozzle was made equivalent by performing a shot peening to the magnetic test piece while surface-inverting the magnetic test piece within the partitioned accommodating section. It was found that any of the magnetic test pieces experienced peening in an area of 99% or more in both surfaces and ends thereof.

Comparative Example 2

The following experiment was conducted by the use of an apparatus having a cylindrical barrel mounted in the blast treating apparatus used in Example 2, in place of the tubular barrel having the rhombic vertical section with respect to the rotational axis. The cylindrical barrel herein is formed of stainless steel (thickness of 0.7 mm) having an opening ratio of a mesh of 70%, to have dimensions of 110 mm in diameter×600 mm in length. The interior is divided into ten by the mesh-net partitioning members (made by the use of stainless-steel linear members) provided vertical to the rotational axis.

Using the deposition apparatus described in Example 1, the magnetic test pieces formed with the aluminum deposited films on the surfaces by the method described in Example 1 were accommodated in the partitioned accommodating sections (totally 60 magnet test pieces were accommodated in the entire apparatus) on a one-to-one basis, to carry out finishing shot peening under the same condition as that of Example 2. Thereafter, surface observation with an electron microscope (×800) was conducted on the both surfaces of 45 mm×30 mm of the ten magnetic test pieces arbitrarily selected, to compute an area subjected to peening for each surface. As a result, peening was made 99% or more in one surface of any of the magnet test pieces. On the other surface, however, peening of 99% or more was done in two among the ten, and peening of 90% to 99% was done in six among the ten, peening of 80% to 90% was done in two among the ten. Thus, great dispersion was caused in the degree of peening between the opposite surfaces. Also, there was large difference in the degree of peening at the end portion between the magnet test pieces.

Example 3

Figure 11:
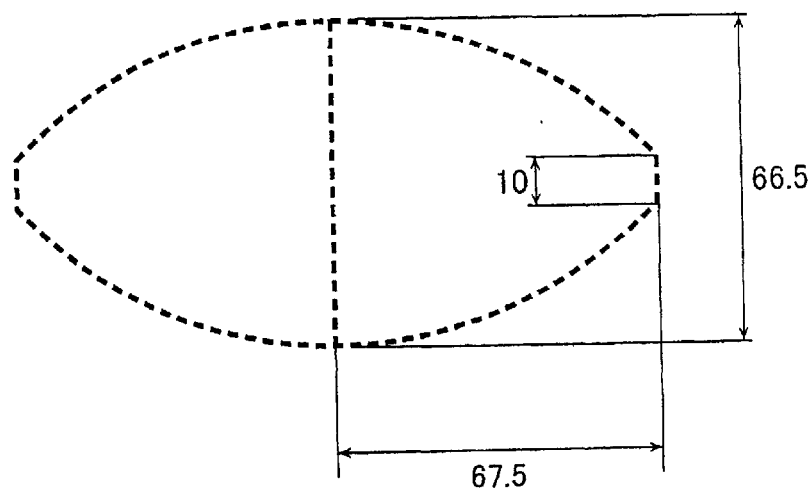
FIG. 11 is a sectional form view of a tubular barrel used in Examples 3 and 4.

The following experiment was conducted by using the deposition apparatus having the tubular barrel in the convex lens form of FIG. 11 mounted in the deposition apparatus used in Example 1, in place of the tubular barrel having the rhombic vertical section with respect to the rotational axis. Herein, the tubular barrel of FIG. 11 having the convex lens form in vertical section with respect to the rotational axis is formed of stainless steel (thickness of 0.7 mm) having an opening ratio of a mesh of 71%, to have dimensions of 600 mm in length. The interior is divided into two symmetrically left and right by a partition formed by a stainless-steel mesh net, thereby forming partitioned chambers. The partitioned chamber is divided into ten by the spiral partitioning members (made by the use of stainless-steel linear members) having a gap provided vertical to the rotational axis.

A shot blasting was made to the magnet test pieces in order to remove the oxidation layer on the surface of each test piece formed in the preceding surface treatment. The magnet test pieces removed of the oxidation layer were accommodated in the partitioned accommodating sections (totally 240 magnet test pieces were accommodated in the entire apparatus) on a one-to-one basis. An aluminum deposited film was formed on the surface of each magnet test piece under the same condition as that of Example 1 except for a deposition time of 13 minutes. After cooling the magnet test pieces, ten magnet test pieces arbitrarily selected were measured as to a film thickness of the aluminum deposited film formed on the both surfaces of 45 mm×35 mm, a result of which is shown in Table 2.

TABLE 2

EXAMPLE 3

| MAGNET NO. | SURFACE A | SURFACE B |
| --- | --- | --- |
| 1 | 7.20 | 7.44 |
| 2 | 6.89 | 7.62 |
| 3 | 6.24 | 5.90 |
| 4 | 8.47 | 8.58 |
| 5 | 8.07 | 7.97 |
| 6 | 6.93 | 7.43 |
| 7 | 7.61 | 8.34 |
| 8 | 6.76 | 6.46 |
| 9 | 8.47 | 8.68 |
| 10 | 6.17 | 6.72 |
| AVERAGE VALUE | 7.28 | 7.51 |
| STANDARD DEVIATION | 0.85 | 0.93 |

As apparent from Table 2, the time the magnet test piece surface faces the evaporating section was made equivalent by forming a deposited film while surface-inverting the magnet test piece within the partitioned accommodating section, thereby making possible to form an even aluminum deposited film on either surface. No mesh traces could be visually confirmed on the aluminum deposited film surface of any magnetic test piece.

Example 4

The following experiment was conducted by using the blast treating apparatus having the tubular barrel in the convex lens form of FIG. 11 mounted in the blast treating apparatus used in Example 2, in place of the tubular barrel having the rhombic vertical section with respect to the rotational axis. Herein, the tubular barrel of FIG. 11 having the convex lens form in vertical section with respect to the rotational axis is formed of stainless steel (thickness of 0.7 mm) having an opening ratio of a mesh of 71%, to have dimensions of 600 mm in length. The interior is divided into two symmetrically left and right by a partition formed by a stainless-steel mesh net, thereby forming partitioned chambers. The partitioned chamber is divided into ten by the spiral partitioning members (made by the use of stainless-steel linear members) having a gap provided vertical to the rotational axis.

Using the deposition apparatus described in Example 3, the magnetic test pieces formed with the aluminum deposited films on the surfaces by the method described in Example 3 were accommodated in the partitioned accommodating sections (totally 120 magnet test pieces were accommodated in the entire apparatus) on a one-to-one basis, to carry out finishing shot peening under the same condition as that of Example 2. Thereafter, surface observation with an electron microscope (×800) was conducted on the both surfaces of 45 mm×35 mm of the ten magnetic test pieces arbitrarily selected, to compute an area subjected to peening for each surface. As a result, the time the magnetic test piece at each surface faces the injection nozzle was made equivalent by performing a shot peening to the magnetic test piece while surface-inverting the magnetic test piece witin the partitioned accommodating section. It was found that any of the magnetic test pieces experienced peening in an area of 99% or more in both surfaces and ends thereof.

Example 5

Figure 12:
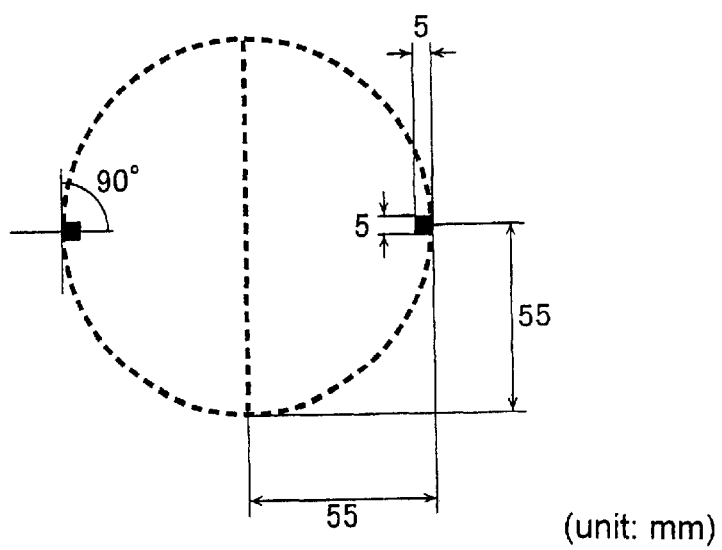
FIG. 12 is a sectional form view of a cylindrical barrel used in Example 5.

The following experiment was conducted by using the deposition apparatus having the cylindrical barrel in the form of FIG. 12 mounted in the deposition apparatus used in Example 1, in place of the tubular barrel having the rhombic vertical section with respect to the rotational axis. Herein, the cylindrical barrel of FIG. 12 having the form in vertical section with respect to the rotational axis is formed of stainless steel (thickness of 0.7 mm) having an opening ratio of a mesh of 71%, to have dimensions of 600 mm in length. The interior is divided into two symmetrically left and right by a partition formed by a stainless-steel mesh net, thereby forming partitioned chambers. The partitioned chamber has, on the barrel inner peripheral surface, a rod-formed protrusion formed of stainless steel of a 5-mm square. Also, the partitioned chamber is divided into ten by the spiral partitioning members (made by the use of stainless-steel linear members) having a gap provided vertical to the rotational axis.

A shot blasting was made to the magnet test pieces in order to remove the oxidation layer on the surface of each test piece formed in the preceding surface treatment. The magnet test pieces removed of the oxidation layer were accommodated in the partitioned accommodating sections (totally 240 magnet test pieces were accommodated in the entire apparatus) on a one-to-one basis. An aluminum deposited film was formed on the surface of each magnet test piece under the same condition as that of Example 1 except for a deposition time of 13 minutes. After cooling the magnet test pieces, ten magnet test pieces arbitrarily selected were measured as to a film thickness of the aluminum deposited film formed on the both surfaces of 45 mm×35 mm, a result of which is shown in Table 3.

TABLE 3

EXAMPLE 5

| MAGNET NO. | SURFACE A | SURFACE B |
|---|---|---|
| 1 | 7.80 | 7.48 |
| 2 | 6.49 | 7.38 |
| 3 | 7.04 | 9.07 |
| 4 | 5.59 | 5.30 |
| 5 | 9.40 | 5.95 |
| 6 | 6.67 | 6.26 |
| 7 | 7.05 | 6.26 |
| 8 | 5.53 | 5.80 |
| 9 | 7.75 | 6.81 |
| 10 | 5.31 | 6.12 |
| AVERAGE VALUE | 6.86 | 6.64 |
| STANDARD DEVIATION | 1.25 | 1.09 |

As apparent from Table 3, the time the magnet test piece at each surface faces the evaporating section was made equivalent by forming a deposited film while surface-inverting the magnet test piece within the partitioned accommodating section, thereby making possible to form an even aluminum deposited film on either surface. No mesh traces could be visually confirmed on the aluminum deposited film surface of any magnetic test piece.

What is claimed is:

1. A deposition apparatus including a vacuum-treating chamber, said vacuum-treating chamber comprising:

an evaporating section for a depositing material;

a tubular barrel having a porous peripheral surface for accommodating a work piece, for treating a surface of the work piece while rotating, said tubular barrel being horizontally arranged about a horizontal rotational axis, the evaporating section being provided in a lower region of the tubular barrel so as to allow deposition material to pass into and out of the tubular barrel through the porous peripheral surface, wherein said tubular barrel has a slide stop for stopping a slide of the accommodated work piece along an inner peripheral surface of said tubular barrel as a result of rotation of said tubular barrel, wherein said tubular barrel has a sectional shape with respect to the rotational axis having at least one corner at an internal single of 30° to 100°, corner being provided as said slide stop, wherein the depositing material consists of at least one of aluminum, zinc, titanium, chromium, magnesium, nickel, an aluminum alloy, a zinc alloy, a titanium alloy, a chromium alloy, a magnesium alloy, a nickel alloy, an aluminum oxide and a titanium nitride, and wherein said work piece is a rare earth metal-based permanent magnet in a plate or bow shape.

2. The apparatus according to claim 1, wherein said tubular barrel has a sectional polygonal shape with respect to the rotational axis having at least three corners at internal angles of 30° to 100°, said corners being provided as said slide stops.

3. The apparatus according to claim 2, wherein said tubular barrel has a sectional shape of a regular triangle with respect to the rotational axis.

4. The apparatus according to claim 2, wherein said tubular barrel has a sectional shape of a square with respect to the rotational axis.

5. The apparatus according to claim 1, wherein said tubular barrel has a sectional shape of a rhombus with respect to the rotational axis.

6. A deposition apparatus including a vacuum-treating chamber, said vacuum-treating chamber comprising:

an evaporating section for a depositing material;

tubular barrel having a porous peripheral surface for accommodating a work piece, for treating a surface of the work piece while rotating, said tubular barrel being horizontally arranged about a horizontal rotational axis, the evaporating section being provided in a lower region of the tubular barrel so as to allow depositing material to pass into and out of the tubular barrel through the porous peripheral surface, wherein said tubular barrel has a slide stop for stopping a slide of the accommodated work piece along an inner peripheral surface of said tubular barrel as a result of rotation of said tubular barrel, wherein said tubular barrel has a sectional shape of a convex curve in a part of said sectional shape with respect to the rotational axis, wherein the depositing material consists of at least one of aluminum, zinc, titanium, chromium, magnesium, nickel, an aluminum alloy, a zinc alloy, a titanium alloy, a chromium alloy a magnesium alloy, a nickel alloy, an aluminum oxide and a titanium nitride, and wherein said work piece is a rare earth metal-based permanent magnet in a plate or bow shape.

7. The apparatus according to claim 6, wherein said tubular barrel has a sectional shape of an ellipse or convex lens with respect to the rotational axis.

8. A deposition apparatus including a vacuum-treating chamber, said vacuum-treating chamber comprising:

an evaporating section for a depositing material;

a tubular barrel having a porous peripheral surface for accommodating a work piece, for treating a surface of the work piece while rotating, said tubular barrel being horizontally arranged about a horizontal rotational axis, the evaporating section being provided in a lower region of the tubular barrel so as to allow depositing material to pass into and out of the tubular barrel through the porous peripheral surface, wherein said tubular barrel has a slide stop for stopping a slide of the accommodated work piece along an inner peripheral surface of said tubular barrel as a result of rotation of said tubular barrel, wherein a protrusion is provided on an inner peripheral surface of said tubular barrel, said protrusion being made as slide stop, wherein the depositing material consists of at least one of aluminum, zinc, titanium, chromium, magnesium, nickel, an aluminum alloy, a zinc alloy, a titanium alloy, a chromium alloy, a magnesium alloy, a nickel alloy, an aluminum oxide and a titanium nitride, and wherein said work piece is a rare earth metal-based permanent magnet in a plate or bow shape.

9. The apparatus according to claim 8, wherein said protrusion is provided at an internal angle of 30° to 100°.

10. The apparatus according to claim 8, wherein said protrusion is in any of a comb shape, a plate shape and a rod shape.

11. The apparatus according to claim 8, wherein a number of said protrusion is one to seven.

12. The apparatus according to any one of claims 1, 6 and 8, wherein said tubular barrel has an interior comprising a plurality of partitioned accommodating sections formed by one or more partitioning members provided perpendicular to the rotational axis of said tubular barrel.

13. The apparatus according to claim 12, wherein said partitioning member is formed by a linear member.

14. The apparatus according to claim 12, wherein a work piece is accommodated in each of said partitioned accommodating sections.

15. The apparatus according to any one of claims 1, 6 and 8, wherein said tubular barrel has an interior comprising a plurality of partitioned chambers formed by one or more partitions parallel to the rotational axis of said tubular barrel.

16. The apparatus according to claim 15, wherein said partitioned chamber is in a sectional shape with respect to the rotational axis having at least one corner at an internal angle of 30° to 100°, said corner being provided as said slide stop.

17. The apparatus according to claim 15, wherein a work piece is accommodated in each of said partitioned chambers.

18. The apparatus according to any one of claims 1, 6 and 8, wherein said porous peripheral surface is a mesh shape peripheral surface.

19. The apparatus according to any one of claims 1, 6 and 8, wherein said porous peripheral surface is a slit shape peripheral surface.

20. The apparatus according to any one of claims 1, 6 and 8, wherein a plurality of tubular barrels is annularly supported at positions circumferentially outward of the rotational axis of a support member rotatable about the rotational axis in a horizontal direction.

* * * * *